United States Patent
Ito et al.

(10) Patent No.: US 7,626,455 B2
(45) Date of Patent: Dec. 1, 2009

(54) DISTORTION COMPENSATION APPARATUS

(75) Inventors: Taizo Ito, Kodaira (JP); Yoichi Okubo, Tokorozawa (JP); Junya Dosaka, Hamura (JP); Toshio Nojima, Sapporo (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 52 days.

(21) Appl. No.: 12/060,502

(22) Filed: Apr. 1, 2008

(65) Prior Publication Data
US 2009/0015326 A1    Jan. 15, 2009

(30) Foreign Application Priority Data
Apr. 23, 2007    (JP) .............................. 2007-112732

(51) Int. Cl.
*H03F 1/26* (2006.01)
(52) U.S. Cl. ...................... 330/149; 375/297; 455/63.1
(58) Field of Classification Search ................ 330/149; 375/297; 455/63.1
See application file for complete search history.

(56) References Cited

U.S. PATENT DOCUMENTS

| | | | |
|---|---|---|---|
| 6,107,877 A * | 8/2000 | Miguelez et al. | 330/66 |
| 7,042,283 B2 * | 5/2006 | Suzuki et al. | 330/52 |
| 7,113,036 B2 * | 9/2006 | Moffatt et al. | 330/149 |
| 7,138,860 B2 * | 11/2006 | Eng | 330/43 |
| 7,161,990 B2 * | 1/2007 | Hori et al. | 375/297 |
| 7,190,222 B2 * | 3/2007 | Okazaki et al. | 330/149 |
| 7,196,576 B2 * | 3/2007 | Mizuta et al. | 330/52 |

FOREIGN PATENT DOCUMENTS

| | | |
|---|---|---|
| JP | 2005-333353 | 12/2005 |
| JP | 2007-180915 | 7/2007 |

* cited by examiner

*Primary Examiner*—Patricia Nguyen
(74) *Attorney, Agent, or Firm*—Brundidge & Stanger, P.C.

(57) ABSTRACT

A distortion compensation apparatus includes distortion generating means for generating distortions to compensate for a distortion generated in an amplifier 2. The distortion generating means includes a nonlinear circuit 13 having an input/output expansion characteristic as a circuit which generates a distortion of the lowest odd order as a compensation target and also includes a nonlinear circuit 18 having an input/output saturation characteristic as a circuit which generates a distortion of another odd order as a compensation target.

3 Claims, 7 Drawing Sheets

WHEN DISTORTION GENERATION CIRCUIT
HAVING EXPANSION CHARACTERISTIC IS USED

FIG.5B

WHEN DISTORTION GENERATION CIRCUIT
HAVING SATURATION CHARACTERISTIC IS USED

DISTORTION COMPENSATION APPARATUS

INCORPORATION BY REFERENCE

The present application claims priority from Japanese application JP2007-112732 filed on Apr. 23, 2007, the content of which is hereby incorporated by reference into this application.

BACKGROUND OF THE INVENTION

The present invention relates to distortion compensation apparatuses and more particularly, to a distortion compensation apparatus which effectively compensates for a distortion.

As typified by a cellar phone, in these days, such a system as to utilize wireless communication widely spreads. Most of recent wireless systems employ a linear modulation scheme, in which amplification circuits for signals are required to have a linearity feature. As typified by multicarrier amplification, further, signals are amplified at once to reduce a cost and increase an efficiency. In order to satisfy such requirements, an amplification system employing a distortion compensation scheme is generally used, but amplification apparatuses employing various types of compensation schemes have also been examined.

A distortion compensation apparatus compensates for distortion by canceling out a distortion generated in an amplifier. There are two type of methods of compensating for distortion, that is, a method of canceling out a distortion generated in a compensation target amplifier using the generated distortion itself (feedforward scheme, feedback scheme) and a method of canceling out the distortion generated in the compensation target amplifier using an element different from the compensation target amplifier (front-end distortion or predistortion (PD) scheme).

The front-end distortion compensation scheme is divided into an analog type using an analog element and a digital type using such a digital signal processing device as a digital signal processor (DSP).

The feedforward scheme has a merit that a high amount of distortion compensation can be realized with stable distortion compensation, but also has a demerit that a circuit scale becomes large and the cost of the feedforward scheme becomes higher than that of the front-end distortion compensation scheme with a bad efficiency.

Meanwhile, the analog front-end distortion compensation method has a merit that a circuit scale becomes small with a good economy, but also has a demerit that an amount of distortion compensation becomes lower than the compensation amounts of the other distortion compensation methods.

The digital front-end distortion compensation method has a merit that a high amount of distortion compensation can be realized with a good power efficiency and a good productivity, but also has a demerit that a circuit scale becomes large and the cost becomes higher than that of the analog arrangement.

In recent years, the analog front-end distortion compensation scheme having a small circuit scale and a good economy has been reconsidered.

SUMMARY OF THE INVENTION

Nonlinear distortions generated in an amplifier include odd and even order distortions.

The odd order distortion, which is generally called intermodulation distortion, results from an odd order term of a power series as which the nonlinear characteristic of an amplifier is approximated, and appears in the vicinity of a signal frequency. Thus the odd order distortion is influenced by adjacent lines.

In the conventional analog front-end distortion compensation, the third order distortion appearing with the highest level in the vicinity of the signal frequency is compensated for, so that a circuit having such a characteristic as to cancel out the third order distortion is provided upstream of a compensation target amplifier to compensate for the distortion.

Figure 7A:
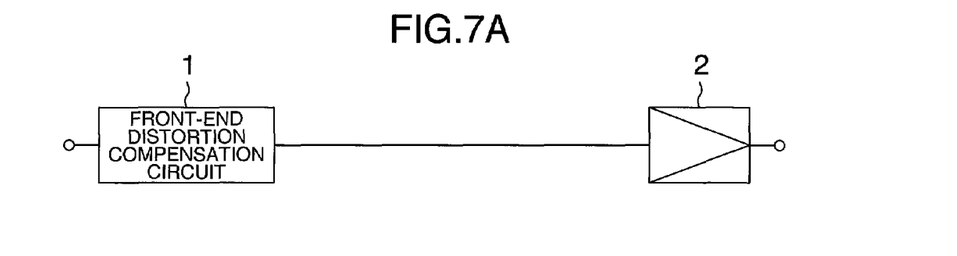
FIGS. 7A and 7B are diagrams for explaining an example of an arrangement of an analog PD (front-end distortion compensation) circuit.

FIG. 7A shows an example when an analog front-end distortion compensation circuit 1 is connected to an amplifier 2 for distortion to be compensated for.

Figure 7B:
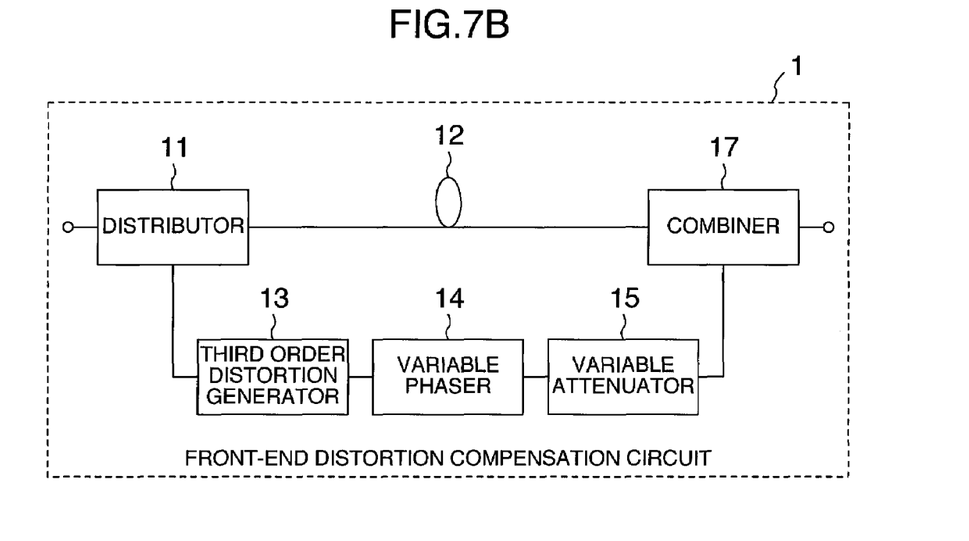

FIG. 7B shows an example of an arrangement of the analog front-end distortion compensation circuit 1.

In the illustrated example of the analog front-end distortion compensation circuit 1, an input signal is distributed from a distributor 11, one of the distributed signals is delayed by a delay line 12 and then applied to a combiner 17. The other distributed signal is input to a third order distortion generator 13 to generate a third order distortion, a signal indicative of the third order distortion is sent to a variable phaser 14 for its phase control, an output of the variable phaser 14 is sent to a variable attenuator 15 for its amplitude control, and then and output of the variable attenuator 15 is sent to the combiner 17. The signal (fundamental wave signal) from the delay circuit 12 and the third order distortion (front-end distortion) signal from the variable attenuator 15 are combined by the combiner 17 to generate a combined signal, and the combined signal is output from an amplifier 2.

In general, an amplifier becomes high in efficiency when the amplifier produces a high output. When it is desired to use the amplifier in a higher-output state, however, not only the third order distortion but also higher-order intermodulation distortions (fifth, seventh, . . . ) are generated and the influences of such higher-order distortions become unnegligible.

Figure 8:
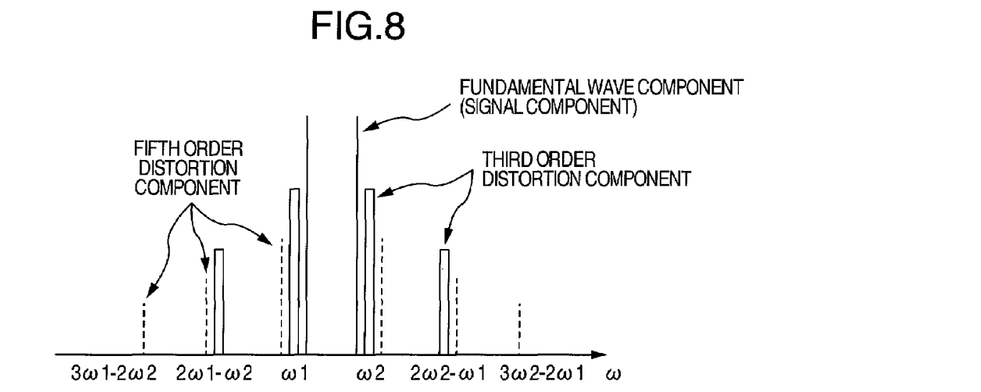
FIG. 8 is a diagram for explaining an example of an output spectrum of an amplifier.

FIG. 8 shows an example of an output spectrum of an amplifier in its high output state when receiving two different frequency signals.

In the drawing, more specifically, fundamental wave components having a frequency f1 (angular frequency ω1) and a frequency f2 (angular frequency ω2) respectively, upper- and lower-side third order distortion components, and upper- and lower-side fifth order distortion components are illustrated.

The high order distortions also influence the low order distortions.

For example, since the fifth order distortion also appears at the same frequency as the third order distortion, the fifth order distortion influences the third order distortion, and the influence of the third order distortion causes a characteristic to be varied. Since a front-end distortion compensation circuit having such a characteristic as to cancel out the original third order distortion is shifted in characteristic, an amount of compensation is disadvantageously reduced.

As a method of solving such a problem, a front-end distortion compensation circuit for compensating for distortions including higher order distortions is provided.

Figure 9:
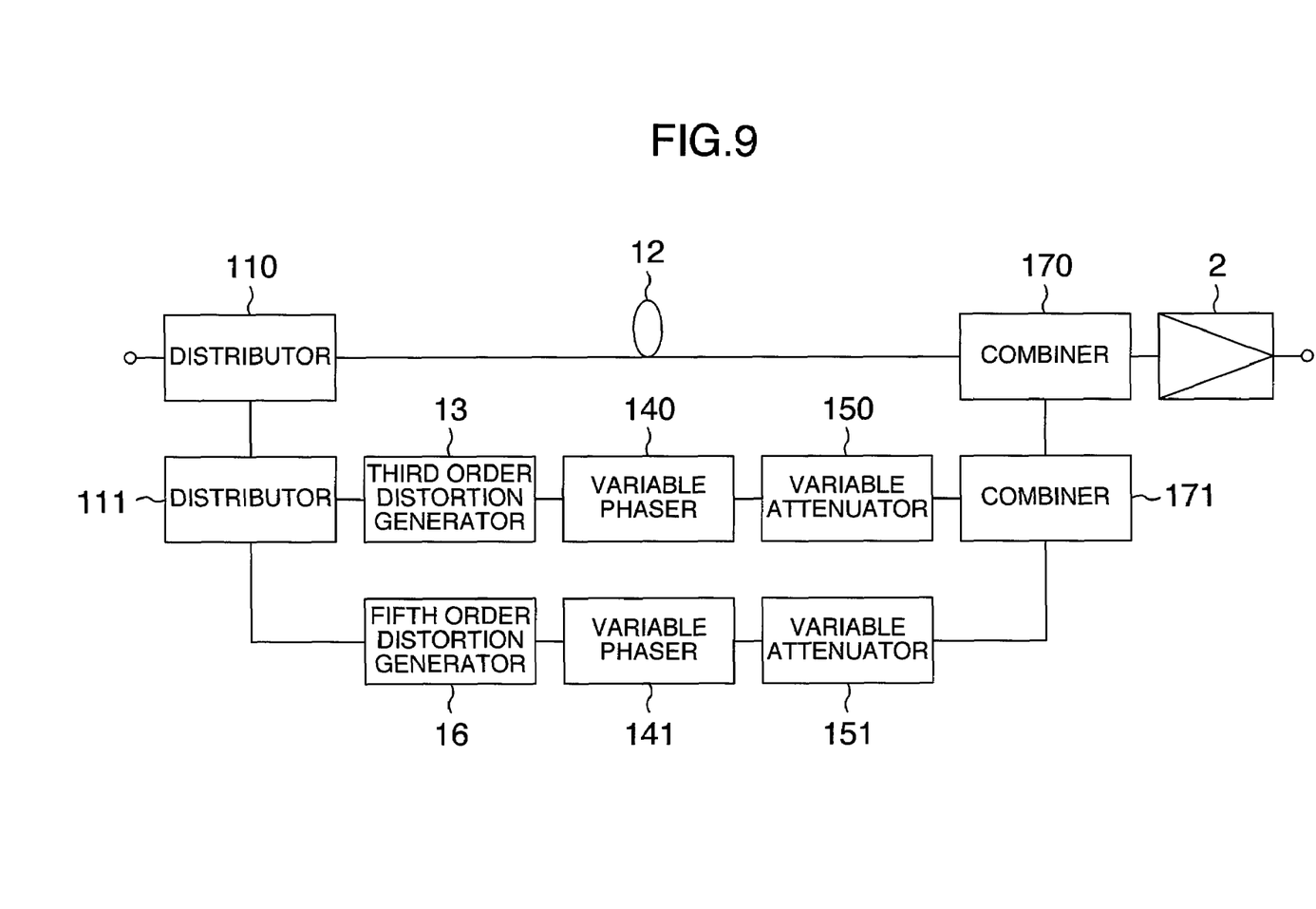
FIG. 9 is a diagram for explaining an example of an arrangement of a front-end distortion compensation circuit when distortions of orders up to a fifth order are considered.

FIG. 9 shows an example of an arrangement of a front-end distortion compensation circuit when distortions of orders up to fifth order are considered.

In the illustrated example of the front-end distortion compensation circuit; a distributor 110, a delay line 12, a combiner 170, a third order distortion generator 13, a variable phaser 140, and a variable attenuator 150 act to compensate for the third order distortion, similarly to such an arrangement as shown in FIG. 7B.

In this example, a distribution signal from the distributor 110 is distributed by a distributor 111 to the third order distortion generator 13 and a fifth order distortion generator 16. A fifth order distortion signal is generated by the fifth order distortion generator 16, the fifth order distortion signal is phase controlled by a variable phaser 141 and also amplitude controlled by a variable attenuator 151. The third order distortion signal from the variable attenuator 150 and the fifth order distortion signal from the variable attenuator 151 are combined by a combiner 171 to generate a combined signal (front-end distortion signal), and the combined signal is input to the combiner 170.

Most of the conventional analog type distortion component circuits use a diode in a distortion generating circuit for the reason that the circuit can have a low consumption power and can be easily arranged. However, the conventional circuit has a problem that the distortion of an order adjacent to the distortion of a compensation target order becomes worse. For example, when it is desired to compensate for the distortions of orders up to the fifth order, the compensation of the distortions of the fifth order causes degradation of the distortion of the third order, which results in that the improvement of the third order distortion compensation is disadvantageously removed.

In view of such circumstances in the prior art, it is therefore an object of the present invention to provide a distortion compensation apparatus which can effectively compensate for a distortion.

In accordance with the present invention, the above object is attained by providing a distortion compensation apparatus which compensates for a distortion generated in a signal amplifier with use of an arrangement which follows.

More specifically, a distortion generating means generates a distortion for compensating for the distortion generated in the amplifier.

And the distortion generating means is arranged to include a nonlinear circuit which has an input/output saturation characteristic and generates distortions of odd orders.

Accordingly, as compared with the use of only a nonlinear circuit having an input/output expansion characteristic, for example, a nonlinear circuit having an input/output expansion characteristic is used. Thus, even when distortions include distortions of orders other than the distortion of the order to be compensated for by the nonlinear circuit, the nonlinear circuit can generate such a distortion as to reduce the distortion of the order adjacent to the compensation target order of the nonlinear circuit and thus can effectively compensate for the distortion.

In accordance with an aspect of the present invention, a distortion compensation apparatus has an arrangement which follows.

That is, the distortion generating means is arranged to include a nonlinear circuit which has an input/output saturation characteristic and generates distortions of odd orders and a nonlinear circuit which has an input/output expansion characteristic and generates distortions of odd orders.

Thus, the use of the nonlinear circuit having an input/output saturation characteristic and the nonlinear circuit having an input/output expansion characteristic generally enables effective distortion compensation.

In accordance with another aspect of the present invention, a distortion compensation apparatus has an arrangement which follows.

That is, the distortion generating means is arranged to include a nonlinear circuit having an input/output expansion characteristic as a circuit which generates a distortion of the lowest odd order as a compensation target, and also include a nonlinear circuit having an input/output saturation characteristic as a circuit which generates a distortion of another odd order as a compensation target.

Thus, when the nonlinear circuit having the input/output expansion characteristic is used for the distortion of the lowest odd order (for example, third order distortion), and when the nonlinear circuit having the input/output saturation characteristic is used for the distortion of the other odd order (for example, fifth or higher order distortion); effective distortion compensation can be generally achieve.

In this case, a signal as a target to be amplified by an amplifier may include various types of signals. For example, when the distortion compensation apparatus is provided in a wireless or wired transmitter, a signal including a plurality of frequencies of signals as transmission targets or a signal including linear modulation components as transmission targets can be used.

As the distortion compensation scheme, one of various types of schemes may be employed. For example, an analog front-end compensation scheme can be used.

For example, for each of orders as compensation targets, a nonlinear circuit for generating a distortion of each compensation target order is provided. In this case, a nonlinear circuit having an input/output saturation characteristic is provided for at least one order.

As the nonlinear circuit having the input/output saturation characteristic, for example, such a circuit as to generate a distortion of an order lower than the compensation target order together with a distortion of the compensation target other.

For example, for each order, a vector adjusting means for adjusting the phase or amplitude of a distortion generated by the nonlinear circuit of the order is provided. The vector adjusting means may be arranged to include, for example, a phase adjusting means (such as a variable phaser) for adjusting a phase or an amplitude adjusting means (such as a variable attenuator) for adjusting an amplitude.

When the vector adjuster is provided for each of the nonlinear circuits of a plurality of orders, the vector adjusters may be arranged to be controlled, for example, in a decreasing sequence of the orders (that is, to adjust the phases or amplitudes of the distortions).

For example, a distribution means for distributing an input signal to linear and nonlinear circuits, a linear circuit for delaying the input signal, a nonlinear circuit for generating a distortion of each order as a compensation target with use of the input signal, a vector adjusting means for adjusting the phase or amplitude of a distortion generated by the nonlinear circuit, and a combination means for combining a signal passed through the linear circuit and a signal passed through the nonlinear circuit (and the vector adjusting means) are provided, and the combined signal is output to an amplifier.

As has been explained above, in accordance with the distortion compensation apparatus of the present invention, in order to generate a distortion to compensate for a distortion generated by an amplifier, the nonlinear circuit having the input/output saturation characteristic is used. Thus when compared with the case where only the nonlinear circuit having the input/output expansion characteristic is used, for example, the present invention can achieve more effective distortion compensation.

DETAILED DESCRIPTION OF THE INVENTION

Embodiments of the present invention will be explained by referring to the accompanied drawings.

In the present embodiments, explanation will be made as to the circuit configuration of a distortion compensation apparatus for reducing a distortion generated in an amplifier used in a base station amplification device or a relay unit in a wireless system and also as to its control method. More in particular, explanation will be made as to a distortion compensation apparatus which uses a front-end distortion compensation circuit as a distortion compensation scheme circuit, has a high compensation with an inexpensive circuit configuration, and achieves stable control.

For the convenience of explanation, similar constituent elements in FIGS. 1, 3, 6, 7, and 9 are denoted by the same reference numerals. The arrangement or configuration of these drawings are illustrated merely as an example, and various sorts of arrangements or configurations may be employed.

Figure 1:
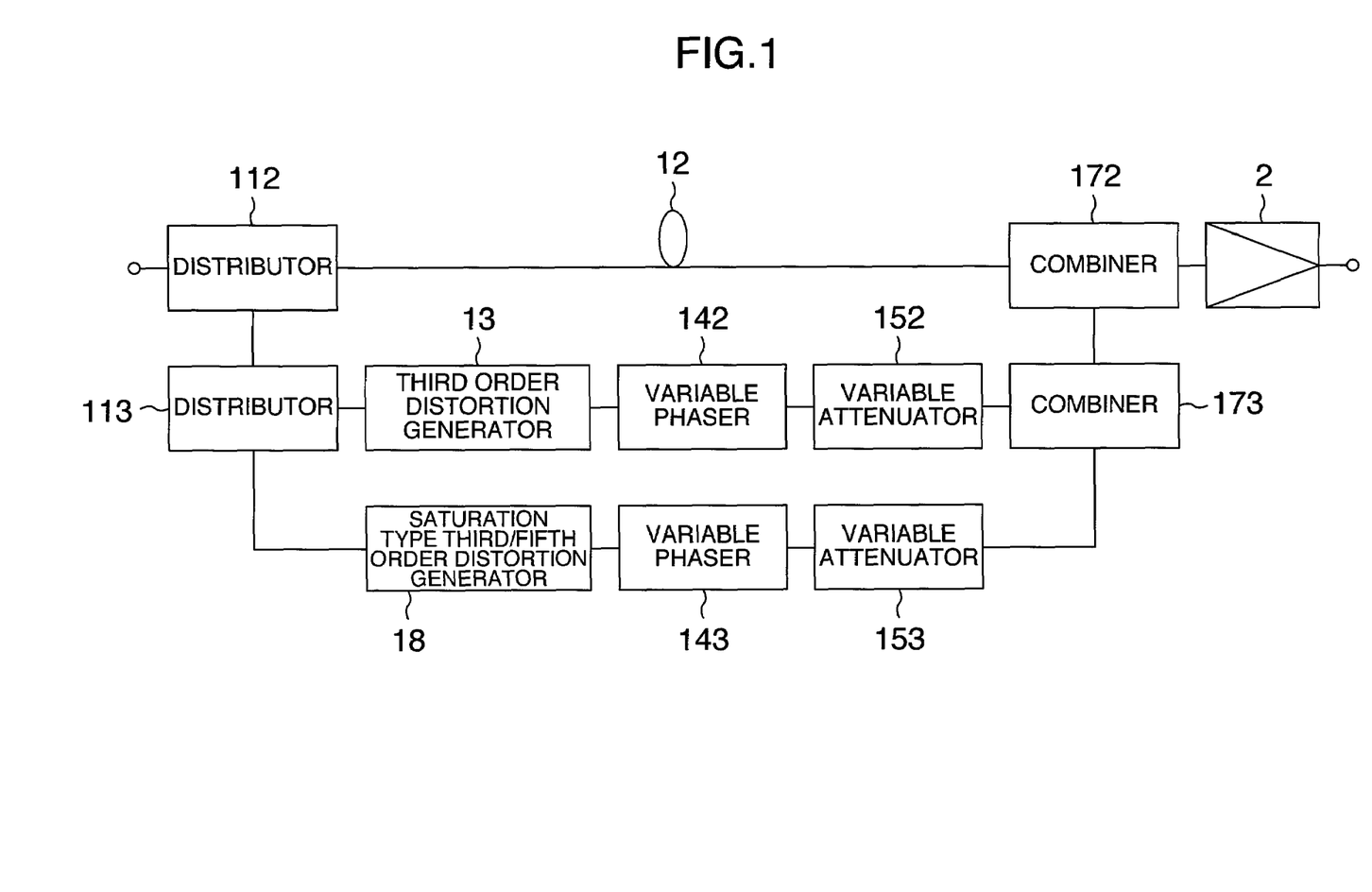
FIG. 1 shows an example of an arrangement of a distortion compensation apparatus in accordance with an embodiment of the present invention.

FIG. 1 shows an example of an arrangement of a distortion compensation apparatus in accordance with an embodiment of the present invention.

The distortion compensation apparatus of the illustrated example includes such a distributor 112 as a power distributor, a delay line 12, such a distributor 113 as a power distributor, a third order distortion generator 13, a variable phaser 142 for adjusting the phase of a third order distortion signal, a variable attenuator 152 for adjusting the amplitude of the third order distortion signal, a saturation type third/fifth order distortion generator 18 for generating third and fifth order distortions, a variable phaser 143 for adjusting the phase of a distortion signal, a variable attenuator 153 for adjusting the amplitude of the distortion signal, a combiner 173, a combiner 172, and an amplifier 2.

In the present example, a delay line 12 is provided at one of outputs of the distributor 112; the other distributor 113 is provided at the other output of the distributor 112; the third order distortion generator 13, the variable phaser 142, and the variable attenuator 152 are provided at one of outputs of the distributor 113; and the saturation type third/fifth order distortion generator 18, the variable phaser 143, and the variable attenuator 153 are provided at the other output of the distributor 113.

An example of the operation of the illustrated distortion compensation apparatus is shown.

A signal as a transmission target is input to the distortion compensation apparatus of the present example.

The signal input to the apparatus is distributed by the distributor 112. The distributed signal is output to the delay line 12 and the distributor 113. The distributor 113 distributes the input signal to the third order distortion generator 13 and the saturation type third/fifth order distortion generator 18 as its outputs.

The third order distortion generator 13 generates a third order distortion signal according to its input signal. The third order distortion signal is passed through the variable phaser 142 and the variable attenuator 152, and then output to the combiner 173. In this case, the phase and amplitude of the third order distortion signal as the output of the third order distortion generator 13 can be controlled by the variable phaser 142 and the variable attenuator 152 independently.

The saturation type third/fifth order distortion generator 18 generates a distortion signal according to its input signal. The distortion signal is passed through the variable phaser 143 and the variable attenuator 153, and then sent to the combiner 173. In this case, the phase and amplitude of the distortion signal as the output of the saturation type third/fifth order distortion generator 18 are independently controlled by the variable phaser 143 and the variable attenuator 153.

The third order distortion signal from the third order distortion generator 13 and the distortion signal from the saturation type third/fifth order distortion generator 18 are combined in the combiner 173 into a combined output signal. The output signal from the combiner 173 is combined with an output signal from the delay line 12 by the combiner 172 into an output signal. The output signal from the combiner 172 is input to the amplifier 2.

In this case, the delay line 12 has a delay time to achieve timing adjustment between the signal passed through the delay line 12 and the distortion signal from the third order distortion generator 13 or the saturation type third/fifth order distortion generator 18.

The amplifier 2 amplifies and outputs an input signal from the combiner 172. The output signal is wirelessly transmitted, for example, from an antenna (not shown).

In this example, the distortion signal from the third order distortion generator 13 or from the saturation type third/fifth order distortion generator 18 causes a distortion signal generated in the amplifier 2 to be reduced, so that the distortion is reduced preferably (or ideally) to zero.

Figure 2:
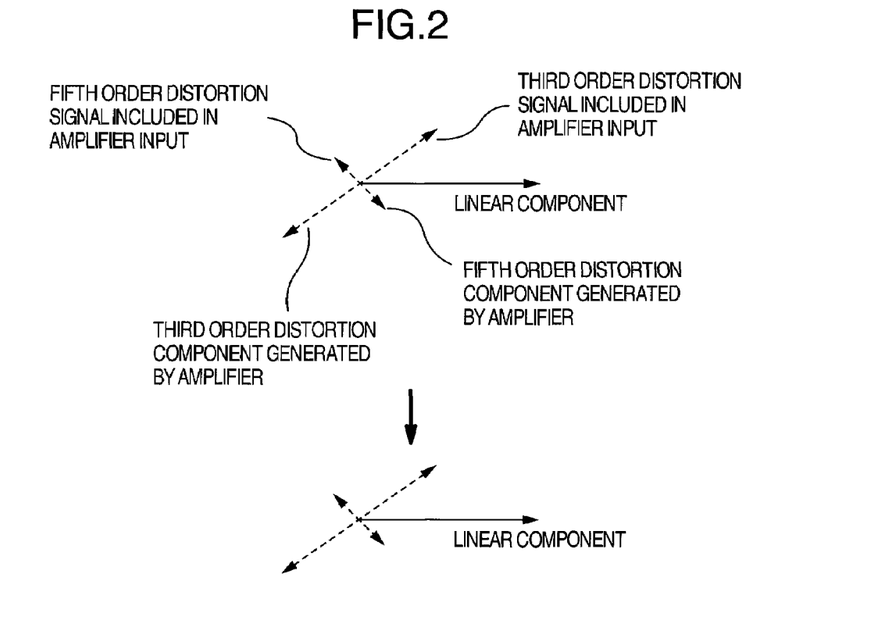
FIG. 2 shows an exemplary principle of distortion compensation.

FIG. 2 shows an example of a principle of distortion compensation.

As shown in FIG. 2, the variable phaser 142, variable attenuator 152, variable phaser 143, and variable attenuator 153 are adjusted so that the third and fifth order distortion signals included in the input signal of the amplifier 2 are made equal in amplitude to the third and fifth order distortion components generated by the amplifier 2 and opposed in phase thereto at the output of the amplifier 2, thus canceling the distortion components and achieving distortion compensation.

Figure 3:
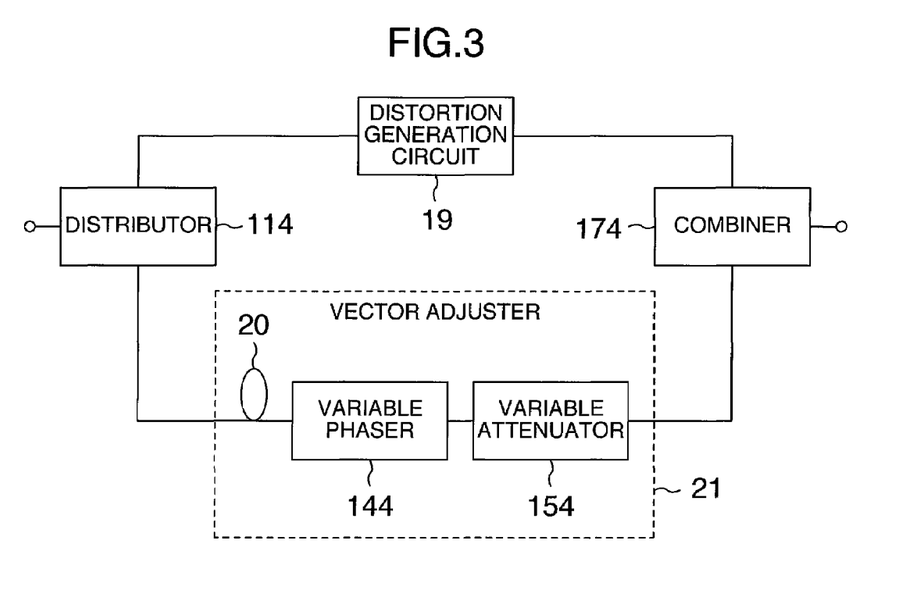
FIG. 3 shows an example of a circuit configuration of a saturation type third or fifth order distortion generator.

FIG. 3 shows an example of a circuit configuration of the saturation type third/fifth order distortion generator 18 in the present embodiment.

The saturation type third/fifth order distortion generator 18 in the present embodiment includes a distributor 114, a distortion generation circuit 19, a vector adjuster 21, and a combiner 174.

The vector adjuster 21 has a delay line 20, a variable phaser 144 for adjusting a phase, and a variable attenuator 154 for adjusting an amplitude.

An example of operation of the saturation type third/fifth order distortion generator 18 in the present embodiment is shown.

A signal input to the saturation type third/fifth order distortion generator 18 is distributed by the distributor 114 and output to the distortion generation circuit 19 and the delay line 20.

The distortion generation circuit 19 generates a distortion signal according to its input signal. The generated distortion signal containing distortion and linear components is output from the distortion generation circuit 19 to the combiner 174.

The linear component passed through the delay line 20 is also passed through the variable phaser 144 and the variable attenuator 154, and then output to the combiner 174. The phase and amplitude of the linear component can be independently controlled by the variable phaser 144 and the variable attenuator 154.

An output signal from the distortion generation circuit 19 and an output signal from the vector adjuster 21 are combined in the combiner 174 and then output. When the vector adjuster 21 is adjusted (a phase is adjusted by the variable phaser 144 and an attenuation is adjusted by the variable attenuator 154) so that these linear components in the above output signals are canceled out, only the distortion component can be extracted.

Even when the vector adjuster 21 is provided at the output side of the distortion generation circuit 19 as another arrangement example, similar effects can be obtained.

As the distortion generation circuit 19, such a nonlinear circuit having a saturation characteristic as an amplification circuit using, for example, a transistor or an FET (Field Effect Transistor) is used.

Explanation will now be made as to expansion and saturation characteristics.

Most of the conventional circuits use a nonlinear circuit having an input/output expansion characteristic of an output power increased with an increased input power. When the input/output characteristic is approximated as a odd order power series, a relation between the input and output powers is expressed by an expression (1).

In the expression, x denotes an input voltage, y denotes an output voltage, a denotes an amplification coefficient for each order, and $a_1$ denotes a linear gain.

$$y = a_1 x + \sum_{n=1}^{\infty} (a_{4n-1} x^{4n-1} + a_{4n+1} x^{4n+1}) \quad (1)$$

Figure 4A:
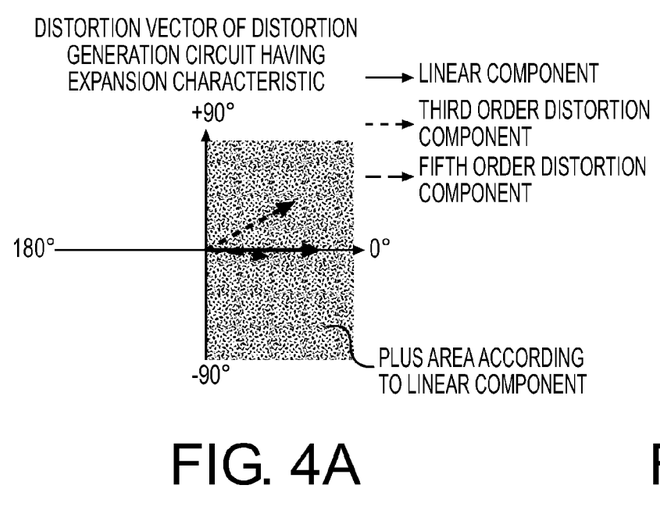
FIGS. 4A to 4D are diagrams for explaining a difference between a distortion vector of an explanation distortion generation circuit and a distortion vector of a saturation type distortion generation circuit.

When phase relation comparison between the orders is made with the term of the first power of a linear component input signal as a reference, distortions take place in a plus direction for components of all terms, and more concretely, distortions take place in such a range between ±90 degrees as shown in FIG. 4A in this embodiment.

Figures 4B, 4D:
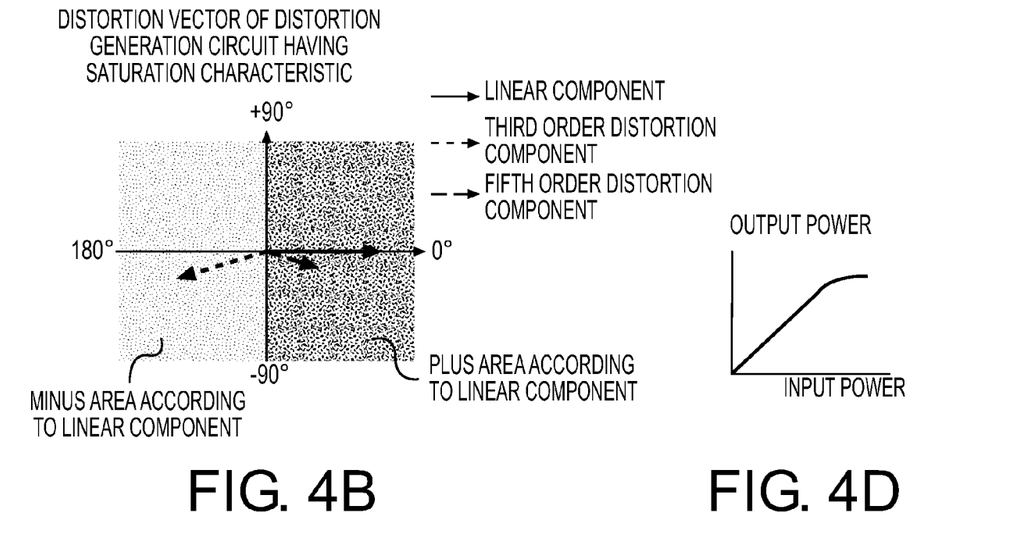
Figure 4C:
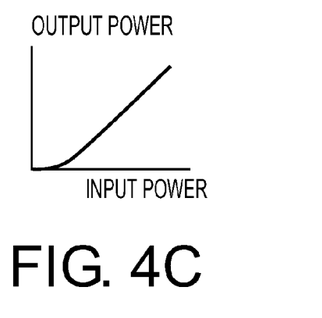

FIG. 4A shows an example of a manner of a distortion vector generated by a distortion generation circuit having an expansion characteristic, and FIG. 4C shows an example of a relation between input and output powers.

Meanwhile, an amplifier for a distortion to be compensated for has a saturation characteristic.

When the saturation characteristic is approximated as a power series expression, a relation between input and output voltages is shown by an expression (2).

In the above expression, x denotes an input voltage, y denotes an output voltage, a denotes an amplitude coefficient for each order, and $a_1$ denotes a linear gain.

$$y = a_1 x - \sum_{n=1}^{\infty} (a_{4n-1} x^{4n-1} - a_{4n+1} x^{4n+1}) \quad (2)$$

When phase relation comparison is made between orders in a phase relation with the first power of an linear component input signal as a reference, the plus and minus signs of the orders alternately appear. Thus distortions appear alternately in a range between ±90 degrees and in a range between ±(90-180 degrees) for each order as shown in FIG. 4B.

FIG. 4B shows an example of a manner of a distortion vector generated by a distortion generation circuit having a saturation characteristic, and FIG. 4D shows an example of a relation between input and output powers.

In this example, distortions of an order adjacent to a distortion of a compensation target order have such a direction as to have a minus coefficient, that is, the adjacent distortions have vectors pointed in mutually opposed directions. Thus when a conventional distortion generator having an expansion characteristic is used, a distortion of an order other than the compensation target order included in the generated distortion causes the distortion components of the adjacent order to point in such directions as to increase, with the result that the adjacent distortions of a plurality of orders cannot be compensated for.

To avoid this, the distortion generation circuit 19 having a saturation characteristic similar to a compensation target amplifier is used in the distortion compensation apparatus of the present embodiment. As a result, since a distortion is generated in such a direction as to compensate for a third order distortion of the compensation target amplifier upon compensation of a fifth order distortion, not only the fifth order distortion generated from the compensation target amplifier can be compensated for, but also the third order distortion can be suppressed to increase. Further, the output of the third order distortion generator 13 enables compensation of the third order distortion of the compensation target amplifier.

Figure 5A:
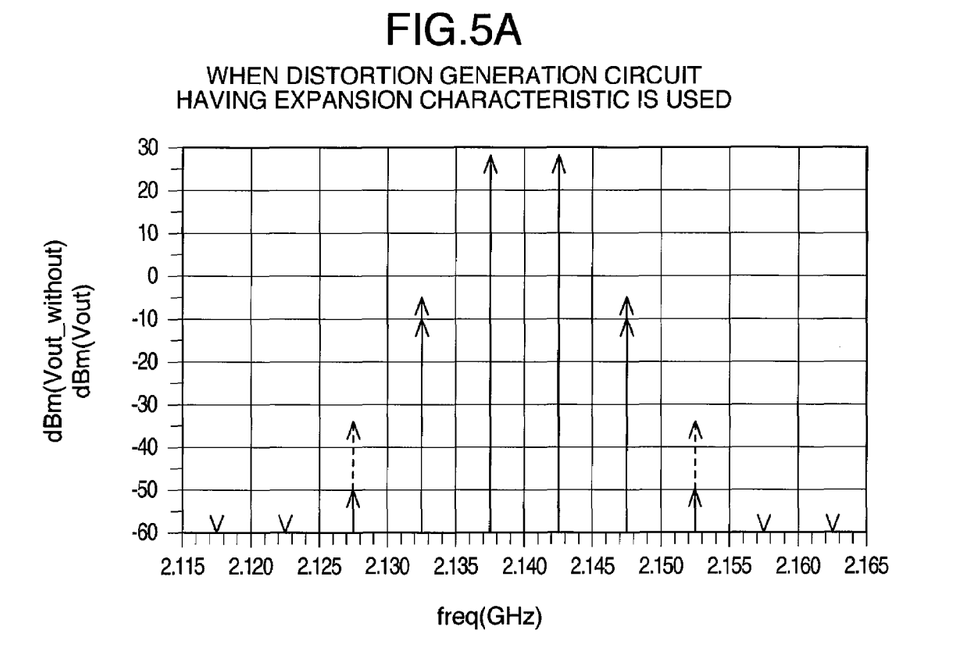
FIGS. 5A and 5B show examples of an output spectrum when fifth order distortion compensation is carried out.

FIG. 5A shows an example of an output spectrum after distortion compensation when a distortion generation circuit having an expansion characteristic is used.

Figure 5B:
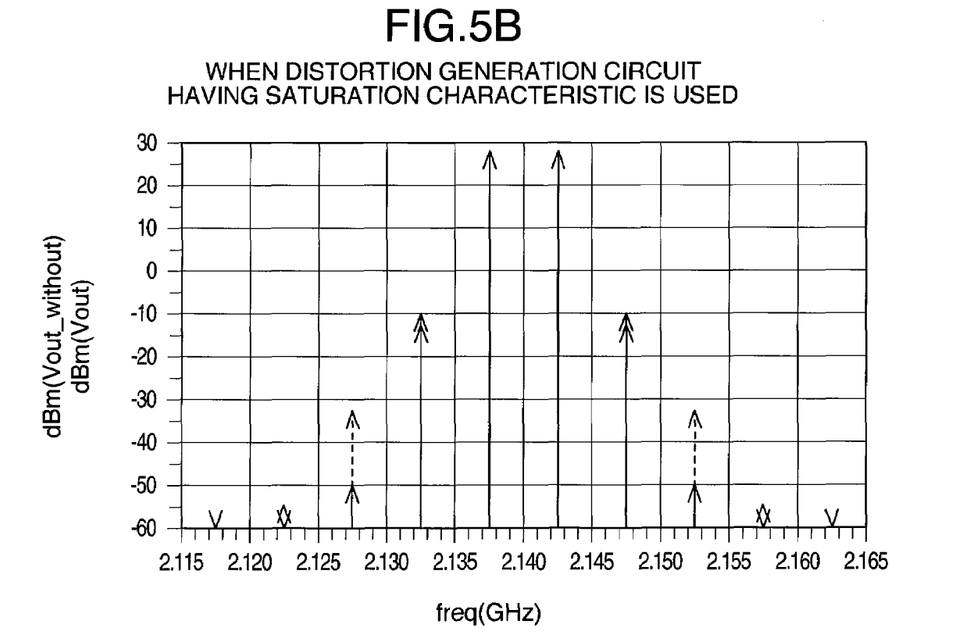

FIG. 5B shows an example of an output spectrum after distortion compensation when a distortion generation circuit having a saturation characteristic is used.

In this example, the distortion compensation circuit is adjusted so as to compensate for the fifth order distortion.

When a distortion generation circuit having an expansion characteristic is used, the third order distortion increases when the fifth order distortion is compensated for. When a distortion generation circuit having a saturation characteristic is used, however, the third order distortion can also be compensated for when the fifth order distortion is compensated for.

When the distortion characteristic of the distortion generation circuit 19 completely coincides with the distortion characteristic of the amplifier 2, the both distortions (third and fifth order distortions) can be completely compensated for with use of the channel only including the saturation type third/fifth order distortion generator 18. In actuality, however, it is considered that it is difficult to use elements having exactly the same distortion characteristic.

To avoid this, when the distortion characteristic of the amplifier 2 and the distortion generation circuit 19 fails to coincide with the distortion characteristic of the distortion generation circuit 19, the variable phaser and the variable attenuator are adjusted, as an example, so as to increase the amount of fifth order distortion compensation and the amount of third order distortion compensation, which results in that compensation conditions can be changed according to its use purpose.

The circuit of the distortion compensation apparatus of the present embodiment is adjusted so as to reduce, for example, the fifth order distortion. In this case, when the fifth order distortion is largely reduced, even the third order distortion can also be effectively compensated for. When the third order distortion (for example, compensation similar to the prior art) is further carried out in addition to the above distortion compensation result, the distortion compensation can be made more effectively.

The third order distortion generator used in this example can be formed using a nonlinear circuit having an expansion characteristic, because of the absence of intermodulation distortions of orders less than the third order.

The third distortion generator may be one of various types of distortion generators. When such a technique as disclosed in JP-A-2007-180915 (filed by the same applicant as the present application) is employed for the third order distortion generator as a preferred example, the distortion generator can generate only the third order distortion easily.

In this connection, as the third order distortion generator, a nonlinear circuit having a saturation characteristic may be used.

Figure 6:
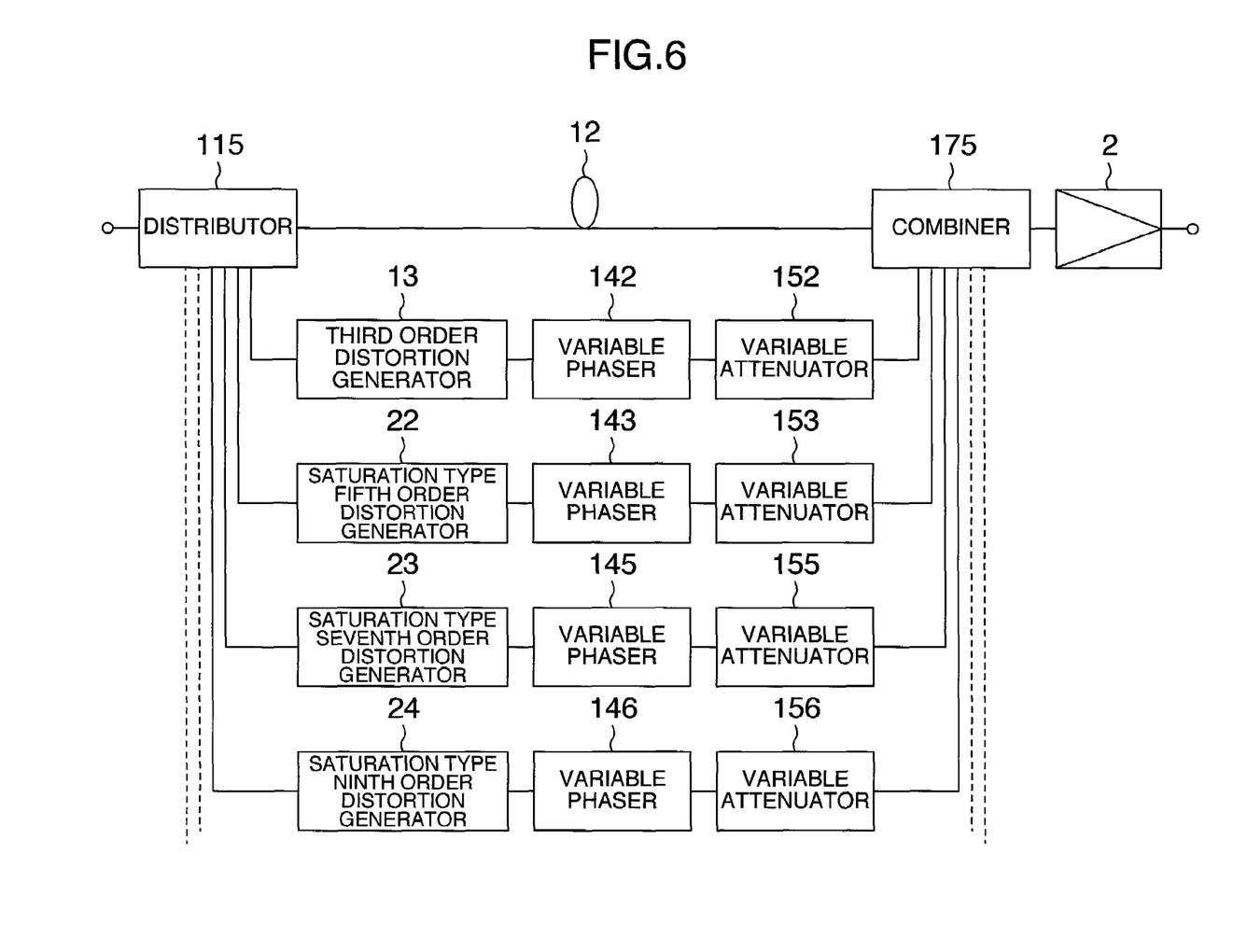
FIG. 6 shows an example of a basic arrangement of a distortion compensation apparatus in accordance with another embodiment of the present invention.

FIG. 6 shows an example of a basic arrangement of a distortion compensation apparatus in accordance with another embodiment of the present invention.

The distortion compensation apparatus of the present embodiment includes a distributor 115, a delay line 12, a combiner 175, an amplifier 2, a third order distortion generator 13, a variable phaser 142, a variable attenuator 152, a saturation type fifth order distortion generator 22, a variable phaser 143, a variable attenuator 153, a saturation type seventh order distortion generator 23, a variable phaser 145, a variable attenuator 155, a saturation type ninth order distortion generator 24, a variable phaser 146, and a variable attenuator 156.

The present embodiment includes saturation type distortion generators of from the ninth order to an arbitrary odd order, and variable phasers and variable attenuators associated therewith. In FIG. 6, saturation type distortion generators and so on for compensating for the higher order distortions are connected in parallel in such a region of the drawing as omitted by dotted lines.

The operation of the distortion compensation apparatus of the present embodiment corresponds to an expansion to the higher orders, for example, shown in FIG. 1. More specifically, the distributor 115 distributes and sends its outputs to the delay line 12, the third order distortion generator 13, and a plurality of the saturation type order distortion generators 22, 23, 24, . . . ; a signal from the delay line 12, a third order distortion signal from a channel including the third order distortion generator 13, and distortion signals from channels respectively including the plurality of saturation type order distortion generators 22, 23, 24, . . . are combined by the combiner 175 to generate a combined signal; and the combined signal is output from the combiner 175 to the amplifier 2. The third order distortion signal of the third order distortion generator 13 can be controlled with respect to its phase and amplitude by the variable phaser 142 and the variable attenuator 152; and the distortion signals of the saturation type order distortion generators 22, 23, 24, . . . can be controlled with respect to their phase and amplitude by the variable phasers 143, 145, 146, . . . and the variable attenuators 153, 155, 156, . . . .

The third order distortion generator 13 may be, for example, of a saturation or expansion type. In this example, however, the third order distortion generator 13 is of a type which can generate only the third order distortion.

In this example, the higher order distortion generators 22, 23, 24, . . . may be of types which also generate distortions of orders less than the respective high orders, which are different, from the conventional pure high order distortion generators. The conventional pure high order distortion generator becomes large in its circuit scale, because another distortion generator is used to generate a low order distortion and the pure high order distortion generated by a subtraction of the low order distortion from the output of high order distortion generator including the low order distortion.

As has been explained above, as an arrangement example, in order to reduce a nonlinear distortion generated when a signal including a plurality of frequency components and linear modulation components is amplified by an amplifier (the amplifier 2 in FIGS. 1 and 6), the distortion compensation apparatus of the present embodiment has a parallel circuit of a linear circuit (having the delay line 12 in FIGS. 1 and 6) and nonlinear circuits, the nonlinear circuits having distortion generators for generating distortions corresponding to odd orders of nonlinear distortions as nonlinear circuits having input/output saturation characteristics (the third order distortion generator 13 and the saturation type third/fifth order distortion generator 18 in FIG. 1; or the third order distortion generator 13 and the saturation type order distortion generators 22, 23, 24, . . . in FIG. 6) and also having vector adjusters for independently controlling the phase and amplitude of the distortions generated in the distortion generators (the variable phasers 142 and 143 and the variable attenuators 152 and 153 in FIG. 1; the variable phasers 142, 143, 145, 146, . . . and the variable attenuators 152, 153, 155, 156, . . . in FIG. 6). Since the phase and amplitude of the signals generated by the distortion generators are changed by the vector adjusters, the distortion compensation apparatus performs distortion compensating operation based on the front-end distortion compensation scheme.

As another arrangement example, in order to reduce a nonlinear distortion generated when a signal including a plurality of frequency components and linear modulation components is amplified by an amplifier (the amplifier 2 in FIGS. 1 and 6), the distortion compensation apparatus of the present embodiment has a parallel circuit of a linear circuit (having the delay line 12 in FIGS. 1 and 6) and nonlinear circuits, the nonlinear circuits including distortion generators for generating distortions corresponding to odd orders of nonlinear distortions as nonlinear circuits (the saturation type third/fifth order distortion generator 18 in FIG. 1; or the saturation type order distortion generators 22, 23, 24, . . . in FIG. 6) having input/output saturation characteristics and as nonlinear circuits (the third order distortion generator 13 in FIGS. 1 and 6) having input/output expansion characteristics and also having vector adjusters for independently controlling the phase and amplitude of the distortions generated in the distortion generators (the variable phasers 142 and 143 and the variable attenuators 152 and 153 in FIG. 1; or the variable phasers 142, 143, 145, 146, . . . and the variable attenuators 152, 153, 155, 156, . . . in FIG. 6). Since the phase and amplitude of the signals generated by the distortion generators are changed by the vector adjusters, the distortion compensation apparatus performs distortion compensating operation based on the front-end distortion compensation scheme.

In the distortion compensation apparatus of the present embodiment having such an arrangement, a nonlinear circuit having an input/output expansion characteristic is used as a distortion generator (the third order distortion generator 13 in FIGS. 1 and 6) of the lowest odd order, and nonlinear circuits having an input/output saturation characteristic are used as distortion generators (the saturation type third/fifth order distortion generator 18 in FIG. 1; or the saturation type order distortion generators 22, 23, 24, . . . in FIG. 6) of the other orders.

In the distortion compensation apparatus of the present embodiment, in this way, when it is desired to reduce nonlinear distortions generated when a signal including a plurality of frequency components and linear modulation component is amplified by an amplifier as far as high order distortions, nonlinear circuits having a saturation characteristic, or nonlinear circuits having a saturation characteristic and nonlinear circuits having an expansion characteristic are used as the distortion generators.

In the distortion compensation apparatus of the present embodiment, as a specific example, a distributor (the distributor 112 in FIG. 1 or the distributor 115 in FIG. 6) for distributing an input signal and a combiner (the combiner 172 in FIG. 1 or the combiner 175 in FIG. 6) for combining output signals from linear and nonlinear circuits are provided; distortion generators (the third order distortion generator 13 and the saturation type third/fifth order distortion generator 18 in FIG. 1; or the third order distortion generator 13 and the saturation type order distortion generators 22, 23, 24, . . . in FIG. 6) for generating distortions are provided between the distributor and the combiner; and distortion components generated by the distortion generators and a linear component passed through the linear circuit are combined by the combiner with use of the input signal distributed by the distributor.

In the distortion compensation apparatus of the present embodiment, as another specific example, a distributor (the distributor 112 in FIG. 1 or the distributor 115 in FIG. 6) for distributing an input signal and a combiner (the combiner 172 in FIG. 1 or the combiner 175 in FIG. 6) for combining output signals from linear and nonlinear circuits are provided; distortion generators (the third order distortion generator 13 and the saturation type third/fifth order distortion generator 18 in FIG. 1; or the third order distortion generator 13 and the saturation type distortion generators 22, 23, 24, . . . in FIG. 6) and vector adjusters (the variable phasers 142, 143 and the variable attenuators 152, 153 in FIG. 1; or the variable phasers 142, 143, 145, 146, . . . and the variable attenuators 152, 153, 155, 156, . . . in FIG. 6) for controlling a phase and an amplitude are provided; distortion components generated by distortion generators and a linear component passed through the linear circuit are combined by the combiner with use of the input signal distributed by the distributor.

In the distortion compensation apparatus of the present embodiment, further, each of the distortion generators of orders generates a distortion including distortions of orders less than the order of the distortion of the associated distortion generator.

Thus, in the distortion compensation apparatus of the present embodiment, the nonlinear circuits having the distortion generators for generating distortions corresponding to the orders of the nonlinear distortions and also having the vector adjusters for controlling the phase and amplitude of the distortions generated in the distortion generators are connected in parallel with each other in order to reduce the nonlinear distortions generated when a signal including a plurality of frequency components and linear modulation component is amplified by the amplifier. With such an arrangement, when an analog circuit is used as the distortion generator and a circuit having a saturation characteristic is used as the distortion generator as an example, the distortion compensation of the apparatus can be improved over the prior art arrangement (for example, using only circuits having an expansion characteristic).

In this way, in this example, when it is desired to obtain a front-end distortion compensation circuit for compensating for an intermodulation distortion corresponding to each of orders including high orders, distortion generators having input/output saturation characteristics can be used to enhance the distortion compensation effect.

In the distortion compensation apparatus of the present embodiment shown in FIG. 1, the distributors 112 and 113 form a distributing means having a function of distributing an input signal; the circuit formed as the delay line 12 forms a linear circuit; the nonlinear circuits (distortion generators) 13 and 18 corresponding to the respective orders form a distortion generating means having a function of generating distortions; the variable phasers 142 and 143 and the variable attenuators 152 and 153 for adjusting the phase and amplitude of distortions generated in the nonlinear circuits of the orders form a vector adjusting means; and the combiners 172 and 173 for combining the signal from the linear circuit and the signals from the nonlinear circuits form a combination means.

In the distortion compensation apparatus of the present embodiment shown in FIG. 6, further, the distributor 115 forms a distribution means having a function of distributing an input signal; a circuit formed as the delay line 12 forms a linear circuit; the nonlinear circuits (distortion generators) 13, 22, 23, 24, . . . of the respective orders form a distortion generating means having a function of generating the distortions; the variable phasers 142, 143, 145, 146, . . . and the variable attenuators 152, 153, 155, 156, . . . for adjusting the phase and amplitude of the distortions generated in the nonlinear circuits of the respective orders form a vector adjusting means; and the combiner 175 for combining the signal from the linear circuit and the signals from the nonlinear circuits form a combination means.

The arrangement of the system or apparatus in accordance with the present invention is not necessarily limited to the aforementioned examples, but may be modified in various ways. The present invention can be provided, for example, in the form of a method or system of executing the processing operation of the invention or in the form of a program for achieving such a method or system or in the form of a recording medium for recording such a program. The invention may also be provided as various types of systems or apparatuses.

The present invention is not necessarily limited to the aforementioned examples, but may be applied to various fields.

Various types of processing operations carried out in the system or apparatus of the present invention may be controlled, for example, under control of a control program stored in a ROM (Read-only Memory) of a processor in a hardware resource having a processor, a memory, and so on;

and various function means for executing the above processing operations may be arranged, for example, as independent hardware circuits.

Further, the present invention can be formed as a computer-readable recording medium such as a floppy (registered trademark) disc or a CD (Compact Disc) having the above control program stored therein or as the control program itself, so that the operation of the present invention can be achieved by inputting the control program from the recording medium into the computer to cause the program to be executed.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A distortion compensation apparatus for compensating for a distortion generated in a signal amplifier, comprising distortion generating means for generating a distortion to compensate for the distortion generated in said amplifier, wherein said distortion generating means includes nonlinear circuits having input/output saturation characteristics for generating distortions of odd orders.

2. A distortion compensation apparatus according to claim 1, wherein said distortion generating means includes nonlinear circuits having input/output expansion characteristics for generating distortions of odd orders.

3. A distortion compensation apparatus according to claim 2, wherein said distortion generating means includes a nonlinear circuit having an input/output expansion characteristic as a circuit which generates a distortion of the lowest odd order as a compensation target and also includes nonlinear circuits having input/output saturation characteristics as circuits which generate distortions of other odd orders as compensation targets.

* * * * *